United States Patent [19]

Matsushita et al.

[11] Patent Number: 4,962,726
[45] Date of Patent: Oct. 16, 1990

[54] CHEMICAL VAPOR DEPOSITION REACTION APPARATUS HAVING ISOLATED REACTION AND BUFFER CHAMBERS

[75] Inventors: Yoshinari Matsushita; Kenji Fukumoto, both of Hirakata, Japan

[73] Assignee: Matsushita Electric Industrial Co., Ltd., Kadoma, Japan

[21] Appl. No.: 268,929

[22] Filed: Nov. 9, 1988

[30] Foreign Application Priority Data

Nov. 10, 1987 [JP] Japan .................................. 62-283516

[51] Int. Cl.⁵ .............................................. C23C 16/00
[52] U.S. Cl. ..................................... 118/719; 118/715; 118/725; 118/730; 414/217; 427/248.1
[58] Field of Search ............... 118/715, 719, 725, 729, 118/730; 427/248.1; 414/217

[56] References Cited

U.S. PATENT DOCUMENTS

| 3,749,383 | 7/1973 | Voigt et al. | 118/729 |
|---|---|---|---|
| 4,047,624 | 9/1977 | Dorenbos | 414/217 |
| 4,503,807 | 3/1985 | Nakayama et al. | 118/728 |
| 4,640,223 | 2/1987 | Dozier | 118/730 |
| 4,666,734 | 5/1987 | Kamiya et al. | 118/719 |
| 4,883,020 | 11/1989 | Kasai et al. | 118/719 |

FOREIGN PATENT DOCUMENTS

| 209150 | 1/1987 | European Pat. Off. . | |
|---|---|---|---|
| 52-64271 | 5/1977 | Japan | 118/730 |
| 61-2330 | 1/1986 | Japan | 118/729 |
| 1267330 | 11/1986 | Japan | 118/730 |
| 2151568 | 7/1987 | Japan | 118/730 |
| 62-290126 | 12/1987 | Japan | 118/729 |
| 63-73620 | 4/1988 | Japan | 118/715 |
| 63-239938 | 10/1988 | Japan | 118/715 |

Primary Examiner—Norman Morgenstern
Assistant Examiner—Terry J. Owens
Attorney, Agent, or Firm—Cushman, Darby & Cushman

[57] ABSTRACT

In a CVD reaction apparatus having a heated reaction chamber (102) and a buffer chamber (103) connected continuously under the reaction chamber and a wafer boat elevator (114) which is to be raised to put the wafer boat (113) in the reaction chamber and brought down to the buffer chamber (103), a vertically moving shutter (122) is provided which gas-tightly isolates the buffer chamber (103) from the reaction chamber (102) during the CVD reaction process and an evacuation tube (123') having an evacuation valve (123) and an inert gas inlet tube (125') are connected to the buffer chamber (103), for maintaining the pressure of the buffer chamber higher than that of the reaction chamber.

3 Claims, 4 Drawing Sheets

CHEMICAL VAPOR DEPOSITION REACTION APPARATUS HAVING ISOLATED REACTION AND BUFFER CHAMBERS

BACKGROUND OF THE INVENTION

1. Field of the Invention

The present invention relates to a chemical vapor deposition apparatus to be used in a chemical vapor deposition (CVD) process employed in manufacturing semi-conductor devices or electronic components, especially to the CVD apparatus of the vertical load lock, reduced-pressure type.

2. Description of the Related Art

Recent trends of high integration and microscopic configuration of semiconductors has resulted in the increase of wafer diameter to as large as 5 inches, 6 inches, and even 8 inches. And it is well-known that, in recent years, polycrystalline silicon film, silicon nitride film or silicon oxide film which are made by chemical vapor deposition (CVD) have played an important role as conductive film, or insulating films for the semiconductors and small electronic components. Especially, in a batch type CVD apparatus using a diffusion furnace which has a high through-put, in order to correspond to the increase of wafer diameter and automation of manufacturing, the CVD processing apparatus changes from the horizontal type to the vertical type. Furthermore, load lock configuration is adopted to prevent thermal oxidation of the silicon wafer by oxygen in the air before CVD processing and to decrease undesirable growth of flakes and dust on the inside wall of the reaction chamber.

The conventional CVD apparatus generally comprises a reaction chamber, which has a boat holder for containing a boat which can hold a number of semiconductor wafers or substrates mounted rotatably on an elevator, a reaction gas injecting port connected to a reaction gas source, an evacuation port connected to a vacuum pump and a heater for heating the reaction chamber and the wafers therein, a loading chamber which is connected to the reaction chamber with a gas-tight gate-valve, and an unloading chamber which is connected to the reaction chamber with another gas-tight gate-valve.

The wafers or substrates to be CVD-treated are first loaded into the loading chamber, and then by temporarily opening the first gas-tight gate-valve, the object wafers or substrates are loaded into the boat in the heated reaction chamber. After completion of the CVD reaction, deposited wafers or substrates are removed from the boat of the reaction chamber to the unloading chamber by temporarily opening the second gas-tight gate-valve.

In the above-mentioned conventional CVD apparatus, the loading chamber and the unloading chamber are connected to evacuation means (i.e., vacuum pumps) through respective valves. The reaction chamber is filled with reaction gas after loading the wafers or substrates therein and closing the gas-tight gate-valves and subsequent evacuation occurs through the evacuation port thereof.

The above-mentioned conventional CVD apparatus has the following problem. The reaction gas entering the reaction chamber is likely to diffuse into the buffer chamber which has a relatively lower pressure than the reaction chamber and to form undesirable deposition of film on various parts in the buffer chamber, such as the boat or wafer holding shelves in the buffer chamber. The deposited film is likely to peel off and make undesirable flakes or dust on the wafers or substrates, thereby inducing defects in the products.

SUMMARY OF THE INVENTION

According to the present invention, the above-mentioned conventional problem of scattered flakes or dust caused by the production of undesirable CVD film deposits in parts other than the reaction chamber is solved by preventing diffusion of the reaction gas from the necessary region in the reaction chamber to unnecessary parts, namely the buffer chamber.

In order to achieve the above-mentioned purpose, the CVD apparatus in accordance with the present invention comprises:

a reaction chamber having an evacuation port connected to an evacuation means, a reaction gas inlet port connected to a reaction gas supply, a heater for heating the objects in the reaction chamber, a buffer chamber connected in vertical continuity with the reaction chamber and having an elevator for bringing up a boat for holding the object wafers in the reaction chamber and for bringing down the boat to the buffer chamber, wherein the boat is rotatably mounted, a loading chamber for gas-tightly storing object wafers about to be loaded into the buffer chamber and connected to the buffer chamber with a first gate and to an inert gas introducing means, and an unloading chamber for gas-tightly storing object wafers after completion of CVD processing until taken out to ambient atmosphere, and connected to the buffer chamber with a second gate and to an inert gas introducing means.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the figures are schematic representations for purposes of illustration and do not necessarily depict the actual relative sizes or locations of the elements shown.

DESCRIPTION OF THE PREFERRED EMBODIMENT

Figure 1:
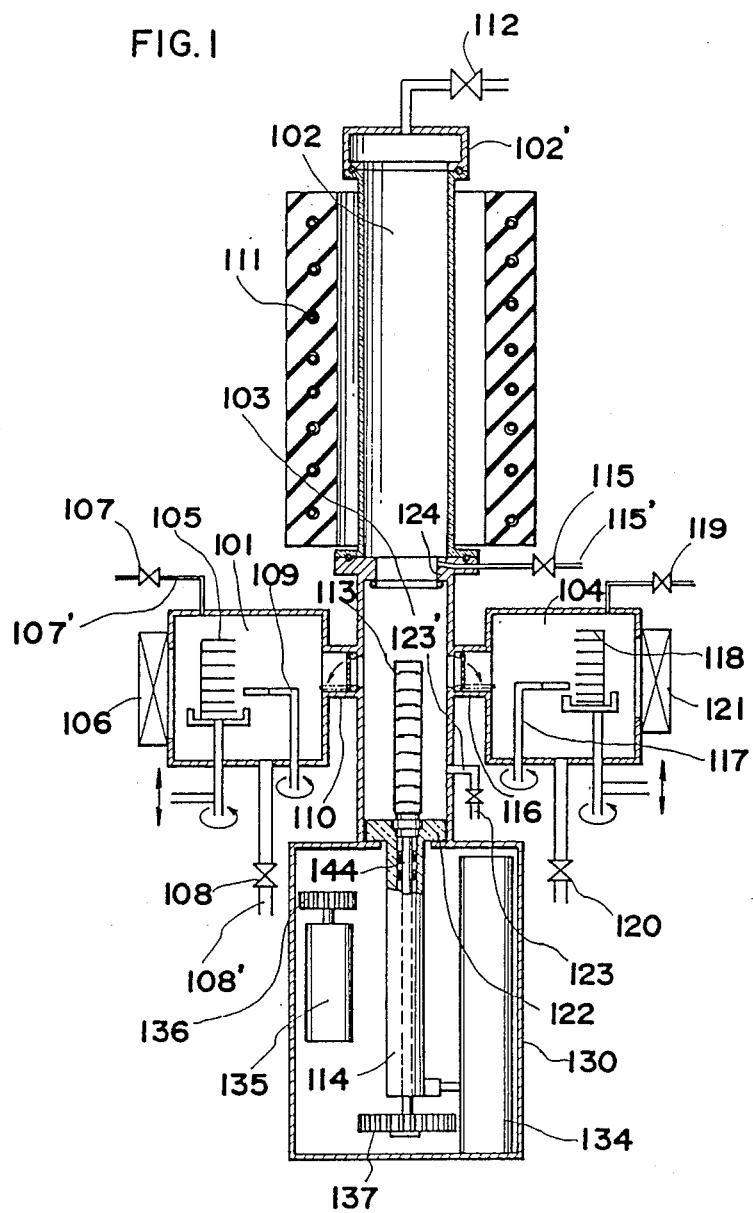
FIG. 1 is a sectional side view of a first embodiment of the CVD apparatus embodying the present invention showing the boat elevator 114 in its lowered position.
Figure 2:
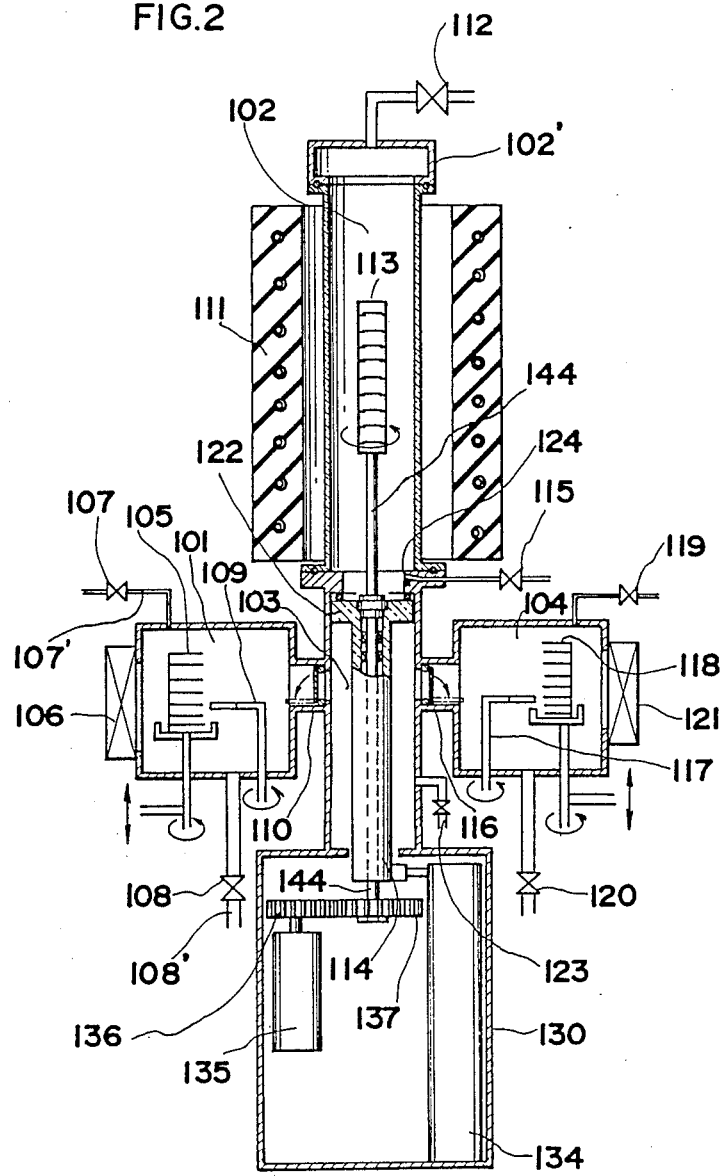
FIG. 2 is a sectional side view of the CVD apparatus of FIG. 1 showing the boat elevator in its raised position.

FIG. 1 and FIG. 2 show a first embodiment of the CVD apparatus in accordance with the present invention, wherein FIG. 1 shows the boat elevator in its lowered position and FIG. 2 shows the boat elevator in its raised position.

The CVD apparatus of the first embodiment comprises a reaction chamber 102 of the vertical pipe type and a buffer chamber 103 which is also of the vertical pipe type having the same diameter as the reaction chamber 102 and connected under the reaction chamber 102 thereby forming a continuous vertical pipe. An evacuation pump (not shown) is connected through an evacuation valve 112 on the top lid 102' of the reaction chamber. Reaction chamber 102 is connected to a reaction gas inlet tube 115' through a reaction gas valve 115. The reaction chamber further has a heater, such as coil heater 111, for heating the CVD treatment object by infrared rays. The buffer chamber 103 is gas-tightly connected to a gas-tight tank 130 situated thereunder. A boat 113 for containing object wafers or substrate to the subjected to CVD is mounted rotatably on a boat elevator 114 which is vertically driven by an elevator driving motor 134 contained in the gas-tight tank 130. The boat elevator 114 has a coaxial shaft 144 therein for rotating the boat 113 in the reaction chamber 102 for uniform CVD operation. The coaxial rotating shaft 144 is driven through detachable gears 136, 137 by a boat rotating motor 135 contained in the gas-tight tank 130. The detachable gears 136 and 137 couple only when the boat elevator 114 is elevated. A loading chamber 101 and an unloading chamber 104 are connected on both sides of the buffer chamber 103 with respective gas-tight gate-valves 110 and 116. The loading chamber 101 is for storing wafers to be subsequently CVD treated, and has a cassette 105 for holding the wafers. A transfer arm 109 for transferring the wafers from the cassette 105 into the boat 113 in the buffer chamber 103 and a gas-tight gate-valve 106 are provided in the loading chamber 101. The loading chamber 101 also has an $N_2$ gas supply tube 107' connected through an $N_2$ valve 107 and also is connected to an evacuation pipe 108' through an evacuation valve 108. The unloading chamber 104 is for storing wafers that have finished the CVD treatment, and has a cassette 118 for holding the wafers. A transfer arm 117 for transferring wafers from the boat 113 in the buffer chamber 103 to the cassette 118 and a gas-tight gate-valve 121 are provided in the unloading chamber 104. The unloading chamber 104 also has an $N_2$ gas supply tube 119' connected through an $N_2$ valve 119 and also is connected to an evacuation pipe 120' through an evacuation valve 120.

The buffer chamber 103 further is connected to another evacuation pump (not shown) through an evacuation valve 123. The buffer chamber 103 also has a vertically moving shutter 122 which is formed as a flange at the top of the boat elevator shaft 114 and moves vertically from the lowest, open position of FIG. 1 to the highest, gas shielding position of FIG. 2.

The vacuum valves 108 and 120 are capable of controlling the pressure of the loading chamber 101 and the unloading chamber 104 from the atmospheric pressure to a vacuum of about $10^{-3}$ torr. The vertically moving shutter 122 is raised up to a flange 124 having an 0-ring thereunder for gas-tight sealing, thereby shielding the buffer chamber 103 from the reaction gas to be injected through the reaction gas valve 115 during the CVD reaction. And at that time, the shielded space in the buffer chamber 103 is evacuated by the evacuation pump through the evacuation valve 123.

Operation of the above-mentioned embodiment is as follows:

First, wafers are loaded in the cassette 105 in the loading chamber 101 through the gate 106, and after closing the gate 106, the loading chamber 101 is evacuated to a vacuum pressure of about $10^{-3}$ torr. Thereafter, the gas-tight gate-valve 110 is opened, and by means of the transferring arm 109, the wafers are transferred from the cassette 105 into the boat 113 through the gas-tight gate-valve 110. Then, after closing the gas-tight gate-valve 110, the boat 113 mounted on the boat elevator 114 is elevated to the midway position of the reaction chamber 102 which has been preliminarily heated to about 620° C. by the heater 111, and the boat is further heated for about 5 minutes until the temperature of the wafers becomes stabilized, and the reaction chamber 102 is continuously evacuated through the evacuation valve 112 to about $10^{-3}$ torr. When the boat 113 is elevated, the vertically moving shutter 122 is brought up to abut the 0-ring on the flange 124 thereby isolating the buffer chamber 103 from the reaction chamber 102. Thereafter, the evacuation valve 123 of the buffer chamber 103 is opened thereby evacuating it, and the reaction gas valve 115 is opened to allow the $SiH_4$ gas to flow into the reaction chamber 102 at a pressure of 0.3–0.5 torr thereby carrying out the CVD reaction. The reaction forms, for instance, a polysilicon film on object wafers which are rotated through rotation of the coaxial shaft 144 by the coupling of the gears 136 and 137. During the CVD reaction process, the pressure of reaction chamber 102 is controlled so that it is kept within about 0.3–0.5 torr of $SiH_4$ gas, whereas the buffer chamber 103 is continuously evacuated by a vacuum pump capable of producing an evacuation pressure of about $10^{-3}$ torr. Thus, even if the reaction gas ($SiH_4$) leaks into the buffer chamber 103, the reaction gas is immediately evacuated by the vacuum pump. Consequently, there is no possibility of depositing fragile polysilicon films on the inner walls of the buffer chamber 103 of relatively low pressure, and hence no possibility of producing flakes of fragile film which may form undesirable dust.

After completion of the CVD reaction, the reaction gas valve 115 is closed and the evacuation valve 112 is opened, thereby evacuating the reaction chamber 102. Then, the vertically moving shutter 122 and the boat elevator 114 is lowered into the position of FIG. 1. Thereafter, the evacuation valve 123 is closed and the gas-tight gate-valve 116 is opened and the wafers on the boat 113 are transferred by the transfer arm 117 into the cassette 118 in the unloading chamber 104. When all the wafers are transferred to the unloading chamber 104, the gas-tight gate-valve 116 is closed and then the $N_2$ gas valve 119 connected to the unloading chamber 104 opens, and at the same time the evacuation valve 120 is closed and the pressure of the unloading chamber 104 is gradually raised to the atmospheric pressure. Then, the gate 121 is opened and the treated wafers are taken out from the unloading chamber 104.

As has been disclosed with reference to FIG. 1 and FIG. 2, according to the present embodiment of the CVD apparatus, the reaction chamber 102 and the buffer chamber 103 are isolated from each other by the vertically moving shutter 122, and the buffer chamber 103 is continuously evacuated during the CVD reaction process in the reaction chamber 102. Therefore, there is substantially no possibility of the reaction gas leaking from the reaction chamber 102 to the buffer chamber 103. Furthermore, even if a very small amount of the reaction gas leaks through the closed vertically moving shutter 122 into the buffer chamber 103, by means of the evacuating operation through the evacuation valve 123, the leaking reaction gas is quickly evacuated outside the buffer chamber 103. Thus, substantially no undesirable fragile film made from the reaction gas is deposited inside the buffer chamber 103.

In a modified embodiment, the evacuation valve 123 may be omitted if the vertically moving shutter 122 perfectly isolates the reaction chamber 102 and the buffer chamber 103.

Figure 3:
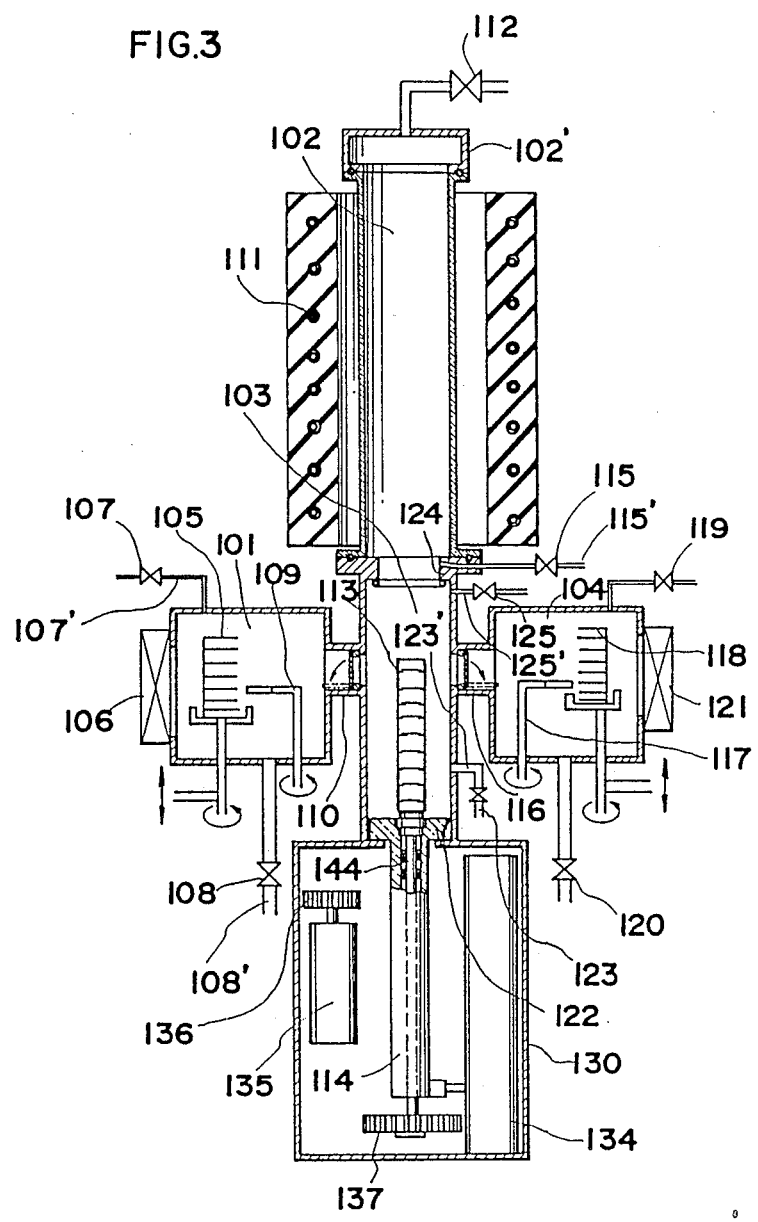
FIG. 3 is a sectional side view of a second embodiment of the CVD apparatus embodying the present invention showing the boat elevator 114 in its lowered position.
Figure 4:
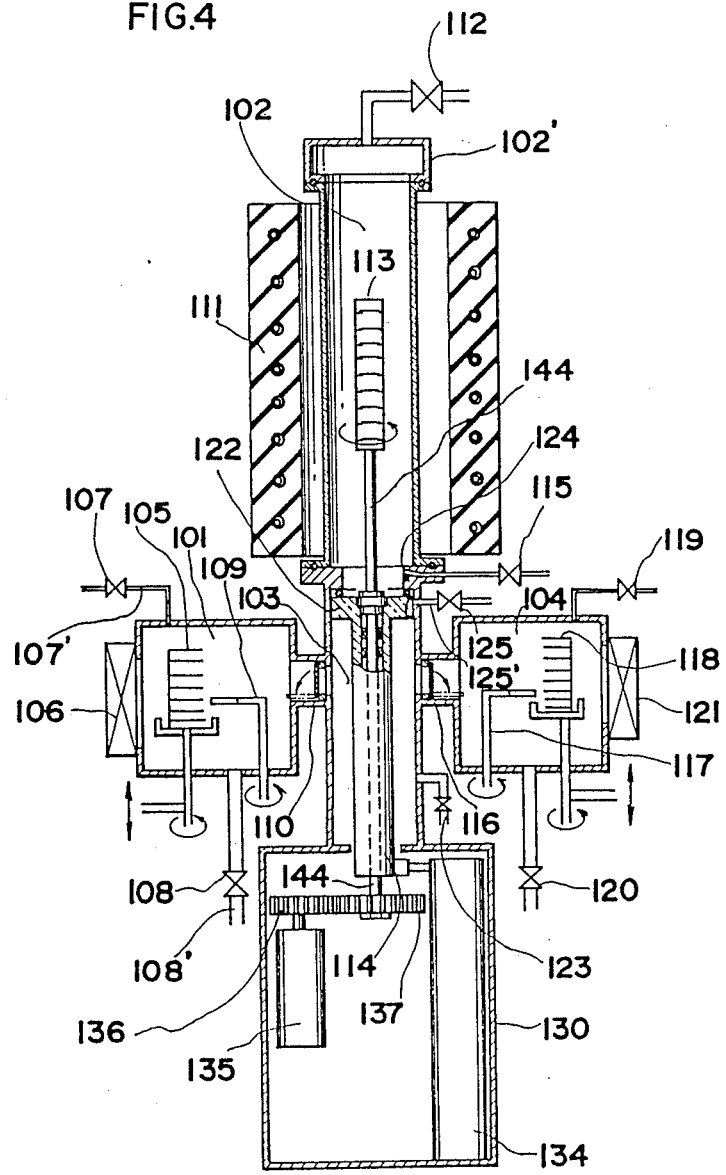
FIG. 4 is a sectional side view of the CVD apparatus of FIG. 3 showing the boat elevator in its raised position.

A second embodiment in accordance with the present invention is disclosed with reference to FIG. 3 and FIG. 4 wherein FIG. 3 shows the wafer boat elevator in its lowest position and FIG. 4 slows the wafer boat elevator in its elevated position.

Corresponding parts and components to the first embodiment are indicated by the same reference numerals, and the description thereof made with regard to the first embodiment similarly applies. The CVD apparatus of the second embodiment also comprises a reaction chamber 102 of the vertical pipe type and a buffer chamber 103 which is also of the vertical pipe type having the same diameter as the reaction chamber 102 and connected under the reaction chamber 102 thereby forming a continuous vertical pipe. An evacuation pump (not shown) is connected through an evacuation valve 112 on the top lid 102' of the reaction chamber. Reaction chamber 102 is connected to a reaction gas inlet tube 115' through a reaction gas valve 115. The reaction chamber further has a heater, such as coil heater 111, for heating the CVD treatment object by infrared rays. The buffer chamber 103 is gas-tightly connected to a gas-tight tank 130 situated thereunder. A boat 113 for containing object wafers or substrate to be subjected to CVD is mounted rotatably on a boat elevator 114 which is vertically driven by an elevator driving motor 134 contained in the gas-tight tank 130. The boat elevator 114 has a coaxial shaft 144 therein for rotating the boat 113 in the reaction chamber 102 for uniform CVD operation. The coaxial rotating shaft 144 is driven through detachable gears 136, 137 by a boat rotating motor 135 contained in the gas-tight tank 130. The detachable gears 136 and 137 couple only when the boat elevator 114 is elevated. A loading chamber 101 and an unloading chamber 104 are connected on both sides of the buffer chamber 103 with respective gas-tight gate-valves 110 and 116. The loading chamber 101 is for storing wafers to be subsequently CVD treated, and has a cassette 105 for holding the wafers. A transfer arm 109 for transferring the wafers from the cassette 105 into the boat 113 in the buffer chamber 103 and a gas-tight gate-valve 106 are provided in the loading chamber 101. The loading chamber 101 also has an $N_2$ gas supply tube 107' connected through an $N_2$ valve 107 and also is connected to an evacuation pipe 108' through an evacuation valve 108. The unloading chamber 104 is for storing wafers that have finished the CVD treatment, and has a cassette 118 for holding the wafers. A transfer arm 117 for transferring wafers from the boat 113 in the buffer chamber 103 to the cassette 118 and a gas-tight gate-valve 121 are provided in the unloading chamber 104. The unloading chamber 104 also has an $N_2$ gas supply tube 119' connected through an $N_2$ valve 119 and also is connected to an evacuation pipe 120' through an evacuation valve 120.

The buffer chamber 103 further is connected to another evacuation pump (not shown) through an evacuation valve 123. In this second embodiment, the difference from the first embodiment is the provision of an inert gas inlet tube 125' connected to the buffer chamber 103 through a valve 125. The buffer chamber 103 also has a vertically moving shutter 122 which is formed as a flange at the top of the boat elevator shaft 114 and moves vertically from the lowest, open position of FIG. 3 to the highest, gas shielding position of FIG. 4.

The vacuum valves 108 and 120 are capable of controlling the pressure of the loading chamber 101 and the unloading chamber 104 from the atmospheric pressure to a vacuum of about $10^{-3}$ torr. The vertically moving shutter 122 is raised up to a flange 124 having an 0-ring thereunder for gas-tight sealing, thereby shielding the buffer chamber 103 from the reaction gas to be injected through the reaction ga valve 115 during the CVD reaction. And at that time, the shielded space in the buffer chamber 103 is evacuated by the evacuation pump through the evacuation valve 123.

The operation of the above-mentioned second embodiment is as follows:

First, wafers are loaded in the cassette 105 in the loading chamber 101 through the gate 106, and after closing the gate 106, the loading chamber 101 is evacuated to a vacuum pressure of about $10^{-3}$ torr. Thereafter, the gas-tight gate-valve 110 is opened, and by means of the transferring arm 109, the wafers are transferred from the cassette 105 into the boat 113 through the gas-tight gate-valve 110. Then, after closing the gas-tight gate-valve 110, the boat 113 mounted on the boat elevator 114 is elevated to the midway position of the reaction chamber 102 which has been preliminary heated to about 620° C. by the heater 111, and the boat is further heated for about 5 minutes until the temperature of the wafers become stabilized, and the reaction chamber 102 is continuously evacuated through the evacuation valve 112 to about $10^{-3}$ torr. When the boat 113 is elevated, the vertically moving shutter 122 is brought up to abut the O-ring on the flange 124 thereby isolating the buffer chamber 103 from the reaction chamber 102. Thereafter, the evacuation valve 123 of the buffer chamber 103 is opened thereby evacuating it, and at the same time, the insert gas inlet valve 125 is opened. Also, at the same time, in the reaction chamber 102, the reaction gas valve 115 is opened to allow the $SiH_4$ gas to flow into the reaction chamber 102 at a pressure of 0.3-0.5 torr, thereby carrying out the CVD reaction. The reaction forms, for instance, a polysilicon film on the object wafers. During the CVD reaction process, the pressure of reaction chamber 102 is controlled so that it is kept within about 0.3-0.5 torr of $SiH_4$ gas, whereas the buffer chamber 103 is continuously evacuated by a vacuum pump capable of producing an evacuation pressure of about $10^{-3}$ torr. In this example, the pressure in the buffer chamber 103 during the period of CVD reaction process is about 10 torr whereas the pressure in the reaction chamber 102 is controlled within a range of 0.3-0.5 torr. That is, the pressure of the buffer chamber 103 is higher than that of the reaction chamber 102 during the CVD reaction process. Therefore, the reaction gas ($SiH_4$) cannot leak from the reaction chamber 102 into the buffer chamber 103. The reason for evacuating the buffer chamber 103 through the evacuation valve 123 during the CVD reaction process is as follows. When $N_2$ gas is simply introduced into the buffer chamber 103 during the CVD reaction period, the pressure in the buffer chamber 103 upon completion of the CVD reaction reaches almost atmospheric pressure. However, the buffer chamber 103 soon must be evacuated to a vacuum of about $10^{-3}$ torr after completion of the CVD reaction to prepare for the next step of opening the vertically sliding shutter 122 and the gas-tight gate-valve 110. The evacuation from the near-atmospheric pressure to a vacuum pressure of $10^{-3}$ torr takes a long time, and hence the inside pressure of the buffer chamber 103 should be retained as low as possible. Another reason for evacuating the buffer chamber 103 is that, if the inside pressure of the buffer chamber 103 becomes too high in comparison to the reaction chamber 102, the gas ($N_2$) in the buffer chamber 103 is liable to leak into the reaction chamber 102 and may undesirably effect the growth of CVD film. Still another reasons for evacuating the buffer chamber 103 is that, even if film that undesirably forms from the leakage of reaction gas from the reaction chamber 102 into the buffer chamber 103 peels off an makes undesirable small dust, such dust will be evacuated outside the buffer chamber 103 by the evacuation through the evacuation valve 123'.

After completion of the CVD reaction, the reaction gas valve 115 is closed and the evacuation valve 112 is opened thereby evacuating the reaction chamber 102 to about $10^{-3}$ torr. At the same time, the inert gas inlet valve 125 is closed, and the buffer chamber 103 is continually evacuated to a vacuum of about $10^{-3}$ torr through the still opened evacuation valve 123. Then, after the pressure of the reaction chamber 102 and the buffer chamber 103 reaches a vacuum of about $10^{-}$'torr, the vertically sliding shutter 122 and the boat elevator 114 are lowered to the position of FIG. 3. Thereafter, the evacuation valve 123 is closed and the gas-tight gate-valve 116 is opened and the wafers on the boat 113 are transferred by the transfer arm 117 onto the cassette 118 in the unloading chamber 104. When all the wafers are transferred to the unloading chamber 104, the gas-tight gate-valve 116 is closed and then the $N_2$ gas valve 119 connected to the unloading chamber 104 opens, and at the same time the evacuation valve 120 is closed and the pressure of the unloading chamber 104 is gradually raised to the atmospheric pressure. Then, the gate 121 is opened and the treated wafers are taken out from the unloading chamber 104.

As has been disclosed with reference to FIG. 3 and FIG. 4, according to the second embodiment of the CVD apparatus, the reaction chamber 102 and the buffer chamber 103 are isolated from each other by the vertically sliding shutter 122, and the buffer chamber 103 is continuously injected with an inert gas ($N_2$), and simultaneously evacuated during the CVD reaction process in the reaction chamber 102. Therefore, there is substantially no possibility of the reaction gas leaking from the reaction chamber 102 into the buffer chamber 103 and remaining therein. Furthermore, even if a very small amount of the reaction gas leaks through the closed vertically sliding shutter 122 into the buffer chamber 103, by means of the inert gas injection and simultaneous evacuation through the evacuation valve 123, the leaking reaction gas is quickly evacuated outside of the buffer chamber 103. Thus, substantially no undesirable fragile film made from the reaction gas is deposited inside the buffer chamber 103.

Apart from the above-mentioned first and second embodiments wherein the CVD reaction is used to form polysilicon films, the present application is similarly applicable to form, for instance, silicon nitride ($Si_3N_4$) film or silicon dioxide ($SiO_2$) film, etc. by changing the composition of the reaction gas.

Furthermore, apart from the above-mentioned second embodiment wherein $N_4$ gas is introduced through the inert gas inlet valve 125, other inert gases, such as Ar or He, may be introduced depending on the necessity.

Although the preferred embodiments of the invention have been described with a certain degree of particularity, it is understood that the details of construction and the combination and arrangement of parts of the preferred embodiments may be changed without departing from the spirit and the scope of the invention as hereinafter claimed.

We claim:

1. A CVD apparatus comprising:
   a reaction chamber having an evacuation port connected to an evacuation means, a reaction gas inlet port connected to a reaction gas supply, and a heater for heating object wafers in said reaction chamber;
   a buffer chamber connected in vertical continuity with said reaction chamber, and connected to an evacuation means and to an inert gas introducing means for maintaining the pressure of said buffer chamber higher than that of said reaction chamber and having an elevator on which a boat for holding said object wafers is rotatably mounted;
   a valve provided on said boat elevator for gas-tightly isolating said reaction chamber and said buffer chamber during the CVD reaction;
   a loading chamber for gas-tightly storing object wafers to be loaded into said buffer chamber and connected to said buffer chamber by a first gate and to an inert gas introducing means; and
   an unloading chamber for gas-tightly storing object wafers after completion of CVD processing until removed to ambient atmosphere, and connected to said buffer chamber by a second gate and to an inert gas introducing means.

2. A CVD apparatus as set forth in claim 1, wherein said inert gas is $N_2$ gas.

3. A CVD apparatus as set forth in claim 1, wherein said reaction gas is $SiH_4$ gas.

* * * * *